(12) United States Patent
Liu

(10) Patent No.: US 7,306,959 B2
(45) Date of Patent: Dec. 11, 2007

(54) METHODS OF FABRICATING INTEGRATED OPTOELECTRONIC DEVICES

(75) Inventor: Yue Liu, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 337 days.

(21) Appl. No.: 11/022,364

(22) Filed: Dec. 22, 2004

(65) Prior Publication Data

US 2005/0169569 A1    Aug. 4, 2005

Related U.S. Application Data

(62) Division of application No. 10/292,578, filed on Nov. 11, 2002, now Pat. No. 6,872,983.

(51) Int. Cl.
  *H01L 21/00* (2006.01)

(52) U.S. Cl. .................. 438/21; 438/7; 438/196; 438/207; 438/41; 257/E25.032; 257/499; 257/E31.127

(58) Field of Classification Search .......... 438/21, 438/7, 41; 257/E25.032, E31.127
See application file for complete search history.

(56) References Cited

U.S. PATENT DOCUMENTS 3,737,986 A * 6/1973 Cranston ............... 228/106

(Continued)

FOREIGN PATENT DOCUMENTS

EP    0881671    12/1998

(Continued)

OTHER PUBLICATIONS

Louderback et al. "Flip-Chip Bonded Arrays of Monolithically Integrated, Microlensed Vertical-Cavity Lasers and Resonant Photodetectors", IEEE Photonics Technology Letters, Mar. 1999, pp. 304-306, vol. II, No. 3.

(Continued)

*Primary Examiner*—Michael Lebentritt
*Assistant Examiner*—Abdulfattah Mustapha
(74) *Attorney, Agent, or Firm*—Workman Nydegger

(57) ABSTRACT

This disclosure concerns methods for fabrication of integrated high speed optoelectronic devices. In one example of such a method, a device region that includes a top surface and a bottom surface is formed on a top surface of a substrate. The device region may take the form of an optical emitter, such as a VCSEL, or a detector, such as a photodiode. Next, an isolation region is formed that is configured such that the device region is surrounded by the isolation region. A superstrate is then disposed on the top surface of the device region. Finally, a micro-optical device, such as a lens, is placed on a top surface of the superstrate.

20 Claims, 6 Drawing Sheets

U.S. PATENT DOCUMENTS

| | | | |
|---|---|---|---|
| 5,119,448 A * | 6/1992 | Schaefer et al. | 385/4 |
| 5,371,822 A | 12/1994 | Horwitz et al. | |
| 5,638,469 A | 6/1997 | Feldman et al. | |
| 5,703,895 A | 12/1997 | Ghirardi et al. | |
| 5,838,703 A | 11/1998 | Lebby et al. | |
| 5,893,722 A | 4/1999 | Hibbs-Brenner et al. | |
| 5,905,750 A | 5/1999 | Lebby et al. | |
| 6,110,393 A | 8/2000 | Simmons et al. | |
| 6,277,668 B1 * | 8/2001 | Goossen et al. | 438/69 |
| 6,410,941 B1 | 6/2002 | Taylor et al. | |
| 6,466,349 B1 * | 10/2002 | Valley et al. | 398/182 |
| 6,546,031 B1 * | 4/2003 | Jewell et al. | 372/45 |
| 6,583,445 B1 * | 6/2003 | Reedy et al. | 257/82 |
| 6,586,776 B1 | 7/2003 | Liu | |
| 6,668,005 B2 * | 12/2003 | Streubel | 372/96 |
| 6,680,963 B2 * | 1/2004 | Liao et al. | 372/96 |
| 6,687,268 B2 * | 2/2004 | Kitamura et al. | 372/22 |
| 6,853,070 B2 * | 2/2005 | Khan et al. | 257/707 |
| 2005/0158902 A1 * | 7/2005 | Chua et al. | 438/32 |

FOREIGN PATENT DOCUMENTS

| | | |
|---|---|---|
| EP | 0881671 A2 | 12/1998 |
| EP | 0905838 | 3/1999 |
| EP | 0905838 A1 | 3/1999 |
| JP | 09223848 | 8/1997 |

OTHER PUBLICATIONS

Coldren et al. "Flip-Chip Bonded, Back-Emitting, Microlensed Arrays of Monolithic Vertical Cavity Lasers and Resonant Photodetectors", Electronic Components and Technology Conference, Sep. 1999, pp. 733-740.

Hibbs-Brenner et al., "Packaging of VCSEL Arrays for Cost-Effective Interconnects at <10 Meters", Electronic Components and Technology Conference, Sep. 1999, pp. 747-752.

Kazlas et al., "Monolithic Vertical-Cavity Laser/p-i-n Photodiode Transceiver Array for Optical Interconnects", IEEE Photonics Technology Letters, Nov. 1998, pp. 1530-1532, vol. 10, No. 11.

Liu, "Heterogenous Integration of OE Arrays With Si Electronics and Microoptics," IEEE Transactions on Advanced Packaging, Feb. 2002, pp. 43-49, vol. 25, No. 1.

Coldren et al. "Flip-Chip Bonded, Back-Emitting, Microlensed Arrays of Monolithic Vertical Cavity lasers and Resonant Photodetectors", Electronic Components and Technology Conference, Sep. 1999, pp. 733-740.

Liu, "Heterogenous Integration of OE Arrays with Si Electronics and Microoptics," IEE Transactions on Advanced Packaging, Feb. 2002, pp. 43-49, vol. 25, No. 1.

* cited by examiner

METHODS OF FABRICATING INTEGRATED OPTOELECTRONIC DEVICES

RELATED APPLICATIONS

This application is a divisional, and claims the benefit, of U.S. patent application Ser. No. 10/292,578, entitled HIGH SPEED OPTICAL TRANSCEIVER PACKAGE USING HETEROGENEOUS INTEGRATION, filed Nov. 11, 2002 now U.S. Pat. No. 6,872,983, incorporated herein in its entirety by this reference.

FIELD OF THE INVENTION

The invention relates generally to high speed optoelectronic packages. More specifically, the invention relates to high speed opto-electronic/electronic integrated circuit devices.

BACKGROUND OF THE INVENTION

Optical interconnect technology is of great importance in a number of applications, including long distance telecommunications, and local area network (LAN) communication systems. As the data communication link speeds of these applications are required to move beyond 1 and 2.5 Gbps towards 5 and 10 Gbps, standard methods of fabrication will falter. The standard methods of packaging electronic devices based on wire bonding packaging will not be able to meet these performance requirements because of the inherent limitations and parasitics associated with device design, wire bond pads, bond wires, and packaging leads.

U.S. Pat. No. 5,638,469 (Feldman et al.) discloses a module having high density optical and electrical interconnections that is capable of integrating an optical transmitter, a detector, and integrated circuit chips. One of the main purposes of the module of Feldman is for aid in aligning the structures, the electrical properties necessary for high speed functioning of the device are not considered.

Co-pending, and commonly assigned U.S. patent application Ser. No. 09/547,538, discloses a method of integrating a top-emitting or top-illuminating optoelectronic device with micro-optics and electronic integrated circuits. Although the design of the device is meant to create high-speed integrated solutions for interconnecting optical and electronic equipment, the problems associated therewith may not be entirely addressed by devices of this invention.

Therefore, there is a need for packaging or integration solutions for optoelectronic and electronic integrated circuit devices that are more suitable for high speed communications applications. A practical solution must meet the following three criteria: (a) it must achieve minimum device level parasitics; (b) it must provide a low parasitic electrical interface with electronic integrated circuits; and (c) the above to features can be implemented using low cost manufacturable processes.

BRIEF SUMMARY OF AN EXEMPLARY EMBODIMENT OF THE INVENTION

In general, exemplary embodiments of the invention are concerned with methods for fabrication of integrated high speed optoelectronic devices. In one example of such a method, a device region that includes a top surface and a bottom surface is formed on a top surface of a substrate. The device region may take the form of an optical emitter, such as a VCSEL, or a detector, such as a photodiode. Next, an isolation region is formed that is configured such that the device region is surrounded by the isolation region. A superstrate is then disposed on the top surface of the device region. Finally, a micro-optical device, such as a lens, is placed on a top surface of the superstrate.

BRIEF DESCRIPTION OF THE FIGURES

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

The invention includes an opto-electronic device with a device region having a bottom surface and a top surface, and a top emitting/illumination window, an isolation region, wherein the isolation region electrically isolates the device region, a superstrate having a bottom surface and a top surface, wherein the bottom surface is positioned upon the top surface of the device region, a micro-optical device positioned upon the top surface of the superstrate. The invention also includes a method of fabricating an opto-electronic device having the steps of forming a device region with a top surface and a bottom surface upon a substrate, forming an isolation region, wherein the isolation region surrounds the device region, forming a superstrate upon the top surface of the device region, integrating a micro-optical device on the top surface of the device region, and bonding an integrated circuit to the bottom surface of the device region.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. It is understood that the embodiments may he combined, that other embodiments may be utilized, and that structural, logical and electrical changes may be made without departing from the spirit and scope of the present invention. The following detailed description is, therefore, not to be taken in a limiting sense, and the scope of the present invention is defined by the appended claims and their equivalents.

Figure 1:
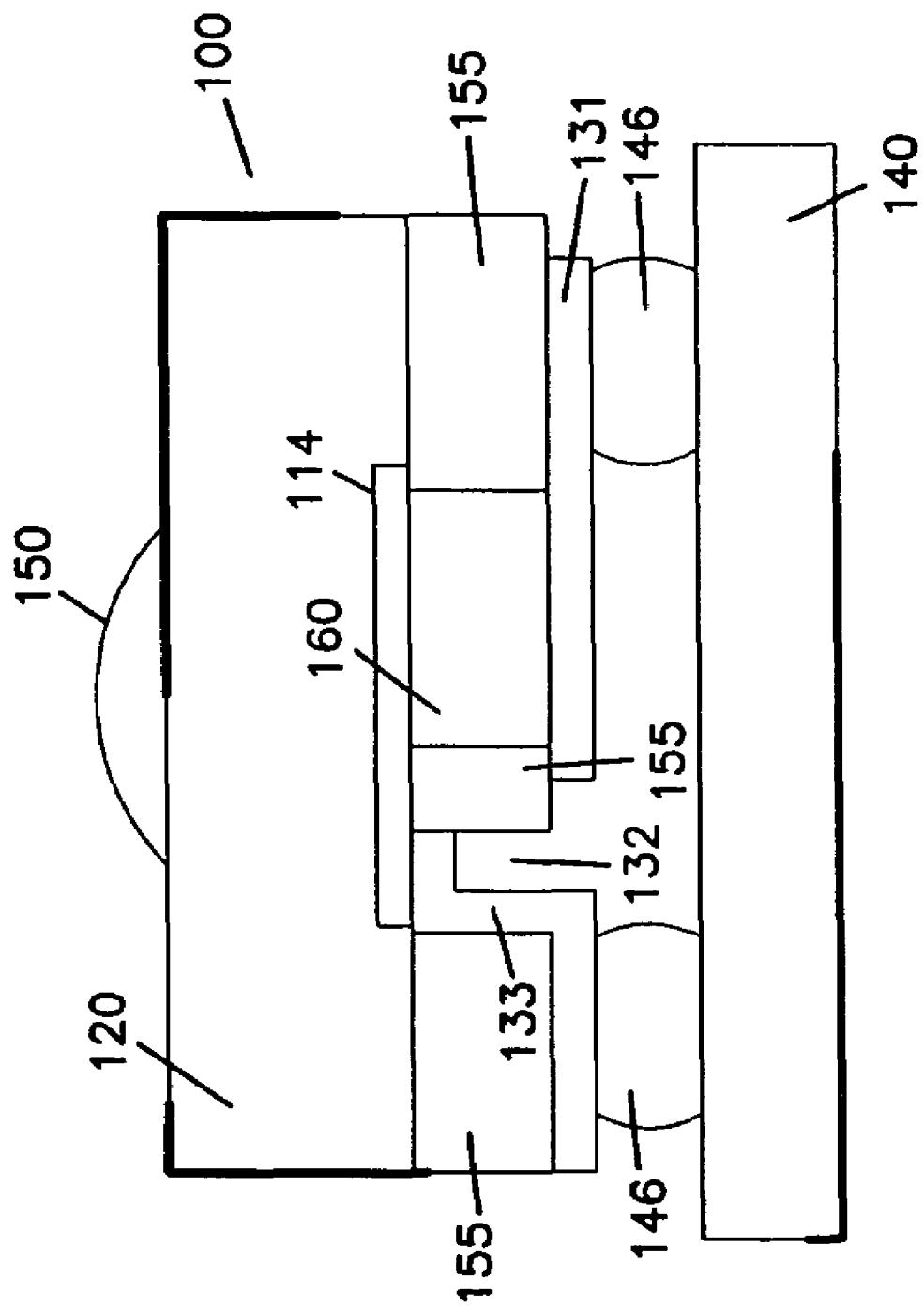
FIG. 1 represents a cross sectional view of a device in accordance with the invention.

A front sectional view of one embodiment of a device of the invention is depicted in FIG. 1. This embodiment is meant to illustrate generally, by way of example, but not by way of limitation, one embodiment of a device 100 according to the invention.

A device 100 according to the invention comprises a device region 160, isolation regions 155, a thru-epi via 132, a thru-epi metal 133, superstrate 120, integrated circuit 140, and an integrated micro-optical device 150. Another embodiment of a device of the invention is illustrated in FIG. 2.

Figure 2:
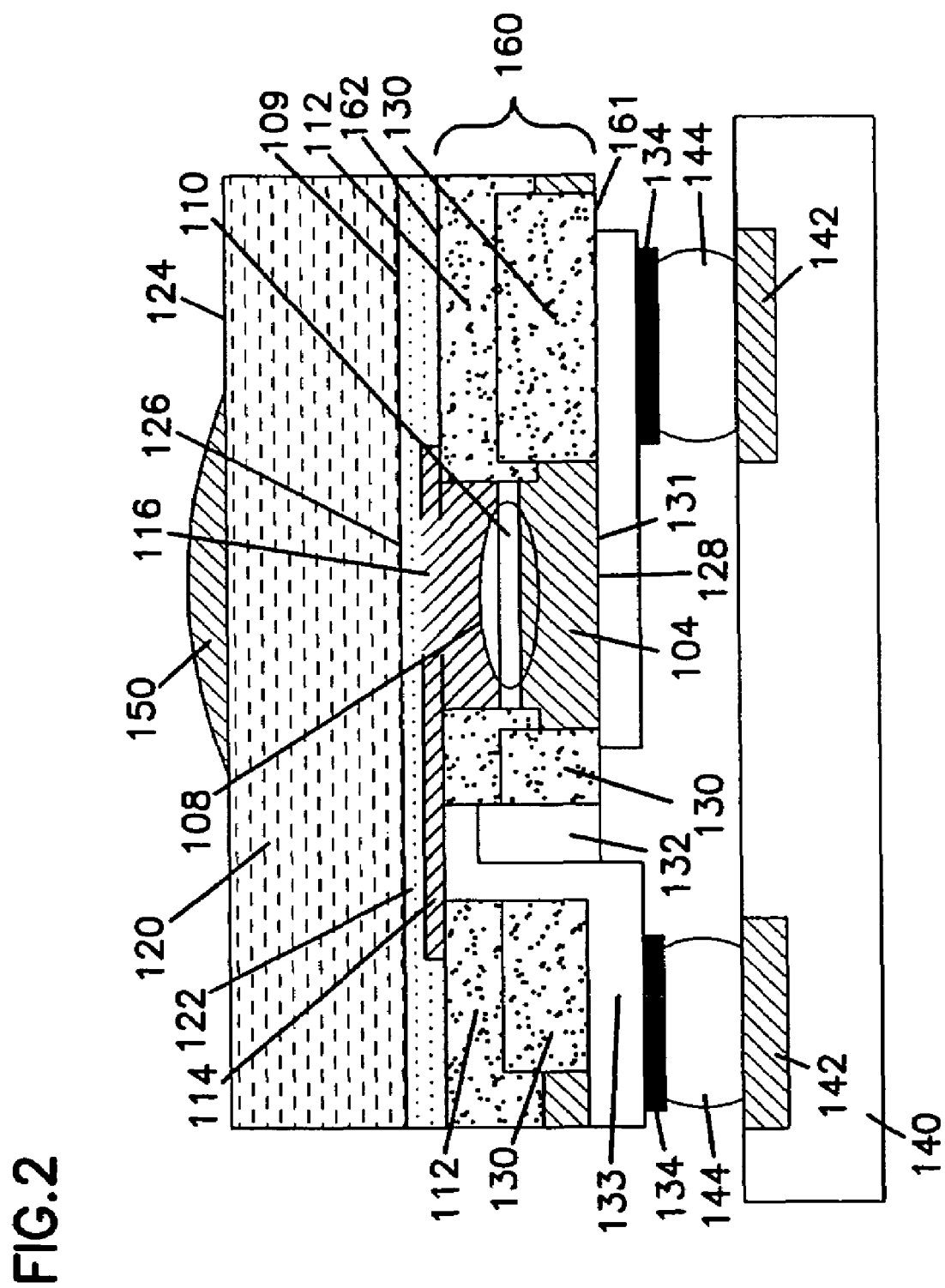
FIG. 2 represents a cross sectional view of a device in accordance with the invention.

In the embodiment of the invention depicted in FIG. 2, the device region 160 includes top emitting/illumination window 116, p-type epilayers 108, active region 110, and n-type epilayers 104. Device region 160 can function as an emitter of radiation, or a detector of radiation. Device region 160 has a bottom surface 161 of device region 160 and a top surface 162 of device region 160.

In embodiments where device region 160 functions as an emitter of radiation, preferably, device region 160 emits light in a vertical fashion. In preferred embodiments, device region 160 can include but is not limited to semiconductor lasers, such as vertical cavity surface emitting laser (VCSEL), or light emitting diodes (LEDs). In this embodiment, device region 160 is most preferably a VCSEL. FIG. 2 depicts a more detailed illustration of a preferred configuration for device region 160 as a VCSEL. Generally VCSELs used as device regions 160 in the invention comprise p-type epilayers 108 that function as a vertically stacked anode, active region 110 that produces the light, and n-type epilayers 104 that function as the cathode. This invention is particularly useful for optoelectronic devices made on semiconductor substrates that are not transparent to the active wavelength of the device. Preferably, the epitaxial layers are made of various compound semiconductor layers that are lattice matched to a GaAs substrate and emit light at a wavelength of from about 630 nm to about 900 nm. Total epitaxial layer thicknesses are typically between about 5 and 15 μm.

In embodiments where device region 160 functions as a detector, preferably, device region 160 can include semiconductor photodetectors such as "pin" and avalanche photodiodes (APD), or the like. FIG. 2 also depicts a more detailed illustration of a preferred configuration for device region 160 as a detector. Generally detectors used as device regions 160 in the invention comprise p-type epilayers 108 that function as a vertically stacked anode, active region 110 that detects the light, and n-type epilayers 104 that function as the cathode. This invention is particularly useful for optoelectronic devices made on semiconductor substrates that are not transparent to the active wavelength of the device. Preferably, the epitaxial layers are made of various compound semiconductor layers that are lattice matched to GaAs substrate and detect light at a wavelength of from 630 nm to about 900 nm. Total epitaxial layer thicknesses are typically less than about 10 μm.

Devices 100 of the invention also include isolation regions 155. Isolation regions 155 function to completely electrically isolate the contacts of device region 160 from the device region 160. Isolation regions 155 are generally positioned to surround the device region 160. Generally, this requires that isolation regions 155 have the same thickness as the original p-type epilayers 108, active region 110 and n-type epilayers 104.

Through isolation of the contacts of device region 160, isolation regions 155 virtually eliminate chip level parasitics. The main source of chip-level parasitic capacitance is associated with the contact pad capacitance which is proportional to the area of the top p-contact pad 114 that is vertically overlapped with the n-type conductive layer or substrate. Because of the elimination of chip level parasitics, devices 100 of the invention can function at the much higher speeds that are required by advances in electronics. Typical parasitic capacitance of a 150×150 μm bond pad on a doped substrate can be about 500 F or higher. Using techniques such as isolation implant, and semi-insulating the substrate or removing the substrate, one can reduce the pad capacitance by an order of magnitude.

Ion implantation is an effective way to selectively reduce electrical conductivity in conductive semiconductor layers. Compared to other techniques, such as etching or milling where semiconductor materials are selectively removed, it has the advantage of retaining planarity of the semiconductor surface and heat conduction near the device active region. A typical 400-500 kilo-electron-volt (keV) ion implantation equipment can generally produce implantations as deep as 4~5 um from the surface of the semiconductor. Higher energy implant equipment can produce deeper implants. However, the higher costs of such high energy implant equipment and its maintenance make it less available. Such ion implantation processes are also less easily controlled.

As seen in the embodiment depicted in FIG. 2, isolation regions 155 may include p-layer isolation region 112 and n-layer isolation region 130. P-layer isolation region 112 and n-layer isolation region 130 are regions of the original p-type epilayers 108 active regions 110 and n-type epilayers 104 in which electrons cannot migrate. In one embodiment, p-layer isolation region 112 and n-layer isolation region 130 are regions of the original p-type epilayers 103 and n-type epilayers 104 in which hydrogen ions have been implanted.

A typical 850 nm wavelength VCSEL structure typically has less than about 4 μm of p-doped epilayer 108, and less than about 5 μm of n-doped epilayer 114 on each side of the active layers 106. It is possible to create an isolated region 112 by implanting from the top surface 113 (add index to FIG. 4) of the p-doped epilayer 108 using a typical low energy ion implant equipment. It is, however, not possible to achieve isolation of the entire epilayers. Therefore, an access pad capacitance 117 exists between overlapped region of the top metal pad 114 and the un-implanted n-doped epilayer 104. By removing the substrate 102 in FIG. 6, one can do a second ion implant from the bottom surface 115 of the n-doped epilayer 104, and create isolated regions 130 in n-doped epilayer 104. Implanted-regions 112 and 130 under the pad 114 eliminate the access pad capacitance.

Devices 100 of the invention can also include thru epi-via 132. Thru epi-via 132 functions to expose the top side contact 114 to the non-emitting surface and to house thru-epi metal 133. A portion of thru epi-via 132 houses thru-epi metal 133. Thru-epi metal 133 functions to bring the p-contact metal 114 to the non-emitting surface of the device region 160. It is preferred to form the thru-epi-via 132 in the isolated region 112 and 130 such that the thru-epi metal 133 will not electrically short the p-type 108 and n-type 104 material of the device. Thru-epi metal 133 can be made of any conductive material generally known to those of skill in the art. The conductive material can be materials such as a metal; e.g., gold (Au), silver (Ag), copper (Cu), aluminum (Al), tungsten (W), an alloy, e.g., aluminum/copper (Al/Cu), titanium tungsten (TiW), or the like. Preferably, the conductive material that is utilized is gold.

A portion of the n-contact metal 131 is formed in direct contact with n-type semiconductor layer 104. A portion of the thru-via-metal 133 is in contact with n-type contact metal 114 and part of 133 is formed on isolated n-type semiconductor 130. This structure gives, the optoelectronic device has both cathode electrode (n-type contact metal) 131, and anode (p-type contact metal) 133 formed on the same plane on the non-emitting side of the device 100. The co-planar nature of these electrodes 131 and 133, allows the co-planar bond pads 134. The bond pads 134 will allow subsequent bump bond 136 of the device 100 to a package substrate or electronics IC 140.

Devices 100 of the invention also include superstrate 120. Superstrate 120 functions to provide mechanical stability to the device 100 while simultaneously allowing transmission of light. Superstrate 120 has a top surface 124 and a bottom surface 126. Top surface 124 of superstrate 120 is generally across from top emitting/illumination window 116, and bottom surface 126 of superstrate 120 is across from top surface 124.

Superstrate 120 is generally optically transparent, as used herein optically transparent refers to a substance that allows either a portion of the light emitted from device region 160 to pass through bottom surface 126 and top surface 124 and or allows a portion of the external light to be detected by device region 160 by passing through both top surface 124 and bottom surface 126. Superstrate 120 is generally comprised of a substance that is capable of providing mechanical stability to device 100 and is optically transparent. Preferably, for minimum mechanical stress superstrate 120 also has thermal properties similar to those of device region 160. Examples of suitable substances for superstrate 120 to be composed of include but are not limited to sapphire, or glasses that have thermal properties that are similar to those of device region 160.

Superstrate 120 generally provides mechanical support to device 100. The minimum thickness of superstrate 120 is dictated in part by this function. Superstrate 120 has a thickness that is sufficient to provide a desired level of mechanical stability to device 100. The thickness of superstrate 120 will also depend in part on its composition. Generally, superstrate 120 is from about 100 to about 500 µm thick, and preferably from about 250 to about 350 µm thick.

In order for superstrate 120 to provide mechanical stability to device 100, it must retain physical contact with the rest of the device 100. Any suitable method of retaining this physical contact can be utilized. Examples of such methods include, but are not limited to, adhering superstrate 120 to the portions of the device 100 which it contacts.

In embodiments of the invention in which superstrate 120 is adhered to the remainder of the device 100, a chemical adhesive is generally used. The chemical adhesive utilized for adhering superstrate 120 to the remainder of the device 100 should be optically transparent, as defined above. Preferably, the chemical adhesive utilized also has thermal properties similar to the superstrate 120, and device region 160 Examples of optically transparent adhesives include for example EPO-353ND adhesive from Epoxy Technology (Billerica, Mass.). Preferably, the physical contact of superstrate 120 to the remainder of the device 100 is retained through adhering superstrate 120 to device region 160 with an adhesive, forming adhesive layer 122 as seen in FIG. 2.

Devices of the invention also include integrated circuit (IC) 140. In one embodiment of the invention, integrated circuit 140 comprises at least one integrated circuit. In this embodiment, the integrated circuit functions to provide communication to the device 100. Specific examples of integrated circuits 140 include, but are not limited to, diode laser drivers (such as a VCSEL driver), and a transimpedance amplifier. In another embodiment, integrated circuit 140 includes a passive package substrate. In this embodiment, the passive package substrate functions to provide electrical interface to the optoelectronic device 100. Examples of types of positive package substrates include, but are not limited to, rigid or flexible organic printed circuit boards, ceramic package substrates, or semiconductor substrates. Generally speaking, integrated circuit 140 is electrically connected to device region 160.

Integrated circuit 140 is positioned below the bottom surface 161 of device region 160. Bonds 136 are used to electrically connect integrated circuit 140 to device region 160. Preferably, bonds 136 electrically connect bottom contact pads 134 to the matching pads 142 of the integrated circuit 140. Bottom contact pads 134 function to allow device region 160 to function by providing electrical contact. The p-contact metal 114 is physically and electrically connected to a bottom contact pad 134 by thru-epi metal 133. Another bottom contact pad 134 is electrically connected to n-contact metal 131. This configuration functions to allow electrical connection to device region 160 from the non-emitting side of the device. Bottom contact pads 134 are bonded to matching pads 142 of integrated circuit 140 preferably by bump bonding. Bump bonding provides very low and predictive parasitic inductance when compared to wire-bonding, which allows more successful impedance matching of optoelectronic devices. Generally, bottom contact pads 134 comprise any suitable conductive material, such as a metal, e.g., gold (Au), silver (Ag), copper (Cu), aluminum (Al), tungsten (W), or an alloy, e.g., copper/copper (Al/Cu), titanium tungsten (TiW), or the like. Preferably, bottom contact pads 134 comprise gold. Bottom contact pads 134 generally have dimensions of about 50 to about 150 µm.

Devices 100 of the invention also include integrated micro-optical device 150. Integrated micro-optical device 150 functions to provide an optical processing capability to devices 100 of the invention. Examples of optical processing capability includes beam shaping, beam focusing, and beam tilting. Integrated micro-optical device 150 can be formed on the device 100, or it can be formed on its own substrate and transferred to and alternatively bonded, or attached to the device 100. In one embodiment of the invention, the integrated micro-optical device 150 is formed on a separate substrate, tested, and validated before it is integrated into the device 100 on the top surface 124 of the superstrate 120. In another embodiment of the invention, the micro-optical device 150 can also be formed directly on the top surface 124 of the superstrate 120. Examples of integrated micro-optical device 150 include, but are not limited to, collimating or focusing lenses, preferably, micro-optical device 150 is a refractive lens.

One embodiment of an exemplary method of fabricating a device 100 of the invention is explained below, with reference to FIGS. 3 through 14.

Figure 3:
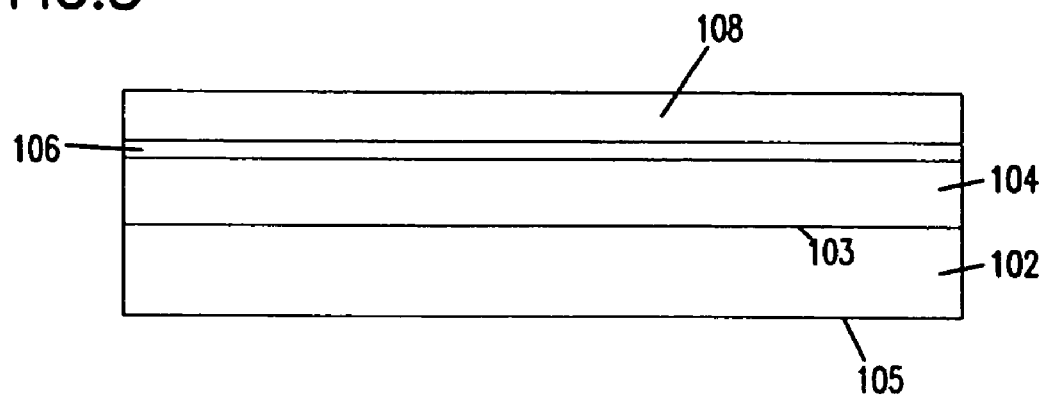
FIGS. 3 through 14 illustrate a method and a device in accordance with one embodiment of the invention.

A substrate 102, is depicted in FIG. 3. Substrate 102 comprises a top substrate surface 103 and a bottom substrate surface 105. Generally substrate 102 is made of any suitable semiconductor material, such as gallium arsenide, InP, GaP, or the like. Preferably, substrate 102 is made of gallium arsenide or its derivatives. Substrate 102 is generally from about 250 to about 1000 µm thick. Preferably substrate 102 is from about 500 to about 700 µm thick. More preferably, substrate 102 is from about 600 to about 650 µm thick.

The first step in forming a device 100 of the invention is the formation of the epitaxial layers of device region 160. Generally speaking, the formation of the device region 160 comprises formation of a number of individual layers. First, n-type epilayer 104 is formed on top substrate surface 103 of substrate 102. Then, active layer 106 is formed on top of n-type epilayers 104. Active layer 106 is then covered by the formation of p-type epilayers 108.

Formation of the individual layers of device region 160 can be accomplished by any methods known to those of skill in the art. An exemplary method of producing an device region 160 that is a VCSEL device can be found in Vertical Cavity Surface Emitting Lasers; Wilmensen, Temkin and Coldren (1999), or U.S. Pat. No. 5,893,722 (Hibbs-Brenner et al.). Generally speaking the majority of the VCSEL, the epitaxial layers can be deposited by any suitable method or technique, such as Metal Organic Chemical Vapor Deposition (MOCVD), Molecular Beam Epitaxy (MBE), Chemical Beam Epitaxy (CBE), or the like. Preferably, the epitaxial layers are deposited by MOCVD.

Formation of the individual layers of a device region 160 that is a pin photodetector can be accomplished by any methods known to those of skill in the art. Generally speaking the majority of pin photodetector epitaxial layers can be formed by any suitable method or technique, such as Metal Organic Chemical Vapor Deposition (MOCVD), Molecular Beam Epitaxy (MBE), Chemical Beam Epitaxy (CBE), or the like. Preferably, the epitaxial layers are deposited by MOCVD.

Figure 4:
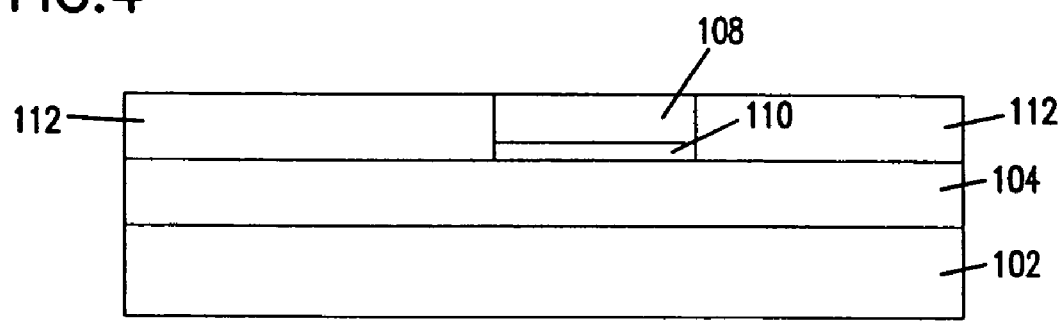

The next step in this exemplary process of making a device 100 of the invention is the step of forming top isolation regions 112, as depicted in FIG. 4. Top isolation regions 112 are generally formed by implantation of ions into the p-type epilayers 108. Preferably, formation of top isolation regions 112 also implants ions into at least a portion of the n-type epilayers 104 of device region 160. For implantation through the p-type epilayers 108, the ions are implanted to a depth of between about 1 and about 4 µm, with a depth of between about 3 and about 4 µm being a preferred range so that a portion of the n-type epilayers 104 are also implanted into. Formation of top isolation region 112 also defines active region 110. Active region 110 is the portion that remains of active layer 106.

Implantation can be accomplished with any suitable ion, such as boron, oxygen, or hydrogen. A preferred ion for implantation is hydrogen. Typically, hydrogen ions are implanted with an energy that ranges from about 20 to about 400 keV, with from about 50 to about 350 keV being a preferred range for the energy of implantation. The does of ions to be implanted ranges from about $10^{12}$ to about $10^{16}/cm^2$, with a preferred range being from about $10^{14}$ to about $10^{15}/cm^2$.

Figure 5:
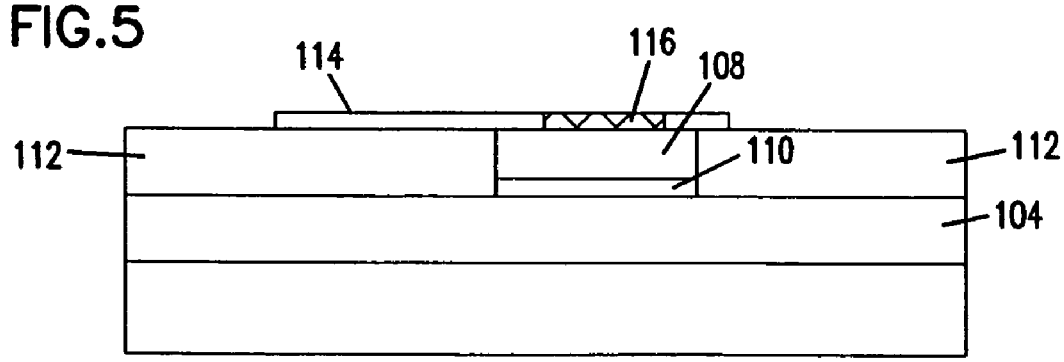

After formation of top isolation regions 112, p-contact metal 114 is then formed in direct contact with the unimplanted region 108 above the active region 110 as illustrated in FIG. 5. P-contact metal should also preferably extend on top of the isolated region 112 where thru-epi via 132 is to be formed later. P-contact metal 114 can be made of any suitable conductive material, such as a metal, e.g., gold, silver, copper, aluminum, tungsten; or an alloy, e.g., aluminum/copper, titanium, tungsten, or the like. Preferably p-contact metal 114 comprises gold or gold/zinc alloy. P-contact metal 114 can be formed by any methods known to those of skill in the art, such as E-Beam deposition, and metal lift-off, or the like. Preferably p-contact metal 114 is formed using E-Beam deposition. An exemplary set of conditions for formation of p-contact metal 114 comprises depositing a 1.5 µm thick layer of gold by E-Beam deposition. An emitter/illumination window 116 is also formed as the result of the metal lift-off. Emitter/illumination window 116 is the region in p-contact metal 114 through which the active region 110 emits light, or detects light.

Figure 6:
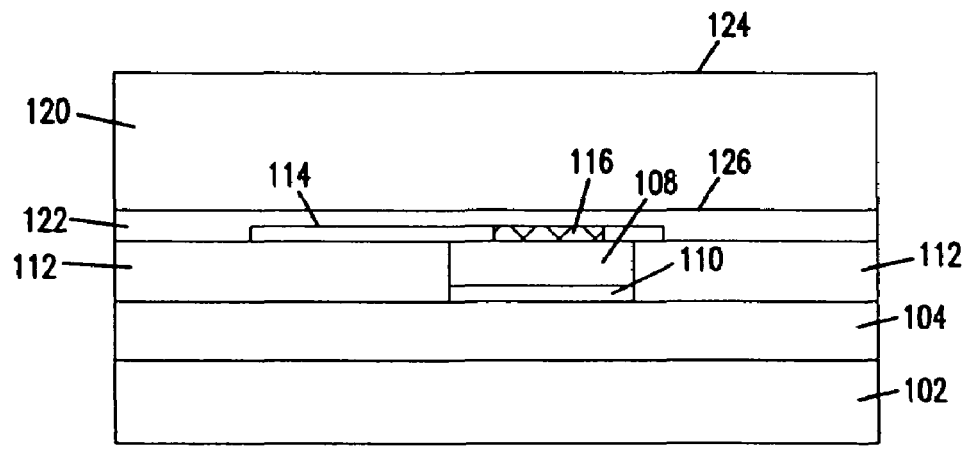

A device of the invention after the next step, deposition of a superstrate 120, is depicted in FIG. 6. Superstrate 120 can either be a separate wafer and attached to the device 100 of the invention, or can be formed on the device itself. Preferably superstrate 120 is a separate wafer and is attached to the device 100. The superstrate 120 is preferably made of a material that is optically transparent to the wavelength of interest. The thickness of the superstrate 120 is preferably more than about 200 µm. Such a thickness provides mechanical stability. The superstrate 120 is also preferably formed of a material that has a coefficient of thermal expansion that is similar to that of the semiconductor device.

As stated above, in order for superstrate 120 to function to provide mechanical stability for the device, it must remain in physical contact with the device. A preferred method of maintaining physical contact between the superstrate 120 and the remainder of the device 100 is to adhere the superstrate 120 to the device. Preferably, an optically transparent chemical adhesive is used, such as EPO-353ND adhesive from Epoxy Technology (Billerica, Mass.) to form adhesive layer 122. The use of the such adhesives is well known to those of skill in the art.

Figure 7:
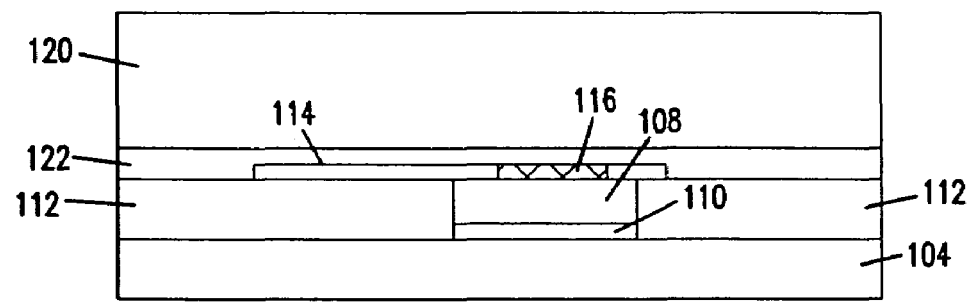

A device of the invention after the next step, removal of the substrate 102, is depicted in FIG. 7. Substrate 102 is removed by starting with bottom substrate surface 105. Substrate 102 can be removed by any method known to those of skill in the art, such as mechanical lapping or grinding, chemical etching, or reactive ion etching (RIE), or the like. Preferably substrate 102 is removed by chemical etching.

Figure 8:
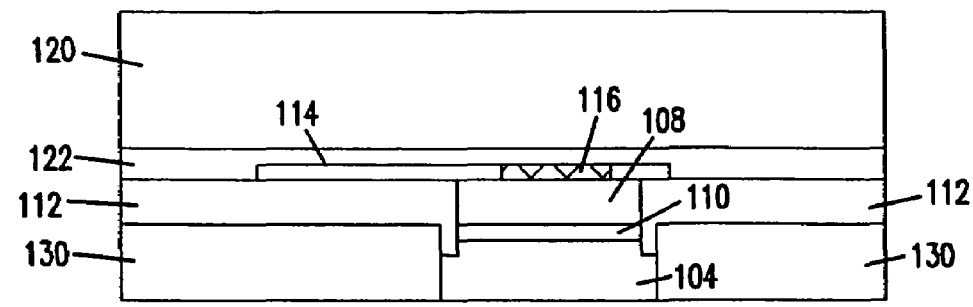

A device of the invention after the next step, formation of bottom isolation regions 130 is depicted in FIG. 8. Bottom isolation regions 130 are formed in the same fashion as were top isolation regions 112. The formation of bottom isolation regions 130 functions to create isolation regions 155 that include top isolation regions 112 and bottom isolation regions 130. Isolation regions 155 function to electrically isolate the contacts of device region 160.

Figure 9:
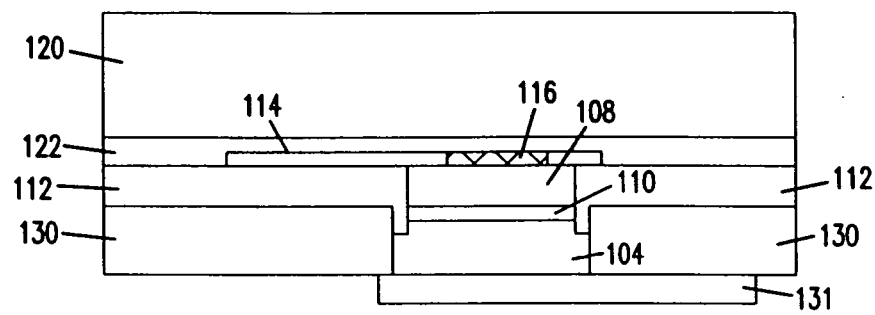

A device of the invention, after the next step, formation of n-type contact metal 131 is depicted in FIG. 9. N-type contact metal 131 can be made of any suitable conductive material, such as a metal, e.g., gold, silver, copper, aluminum, tungsten; or an alloy, e.g., aluminum/copper, titanium, tungsten, gold/germanium or the like. Preferably bottom contact pads 132 comprise gold. N-type contact metal 131 can be formed by any methods known to those of skill in the art, such as E-Beam deposition, sputtering and patterned with lift-off process, or the like. Preferably n-type contact metal 131 is formed using E-Beam deposition. An exemplary set of conditions for formation of n-type contact metal 131 comprises depositing a 1.5 µm thick layer of gold by E-Beam deposition.

Figure 10:
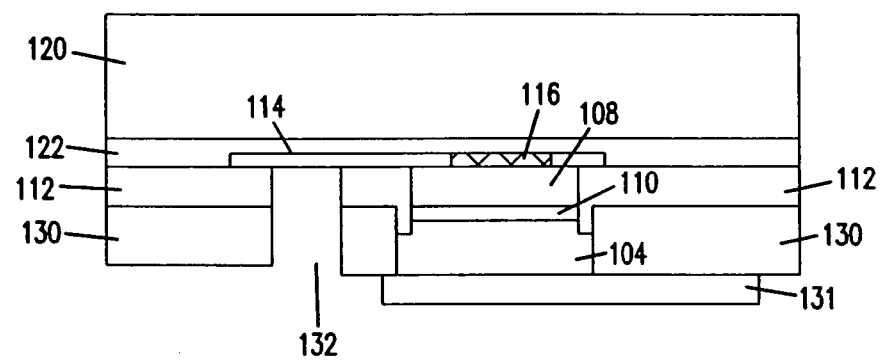

A device of the invention after the next step, formation of the thru-epi via 132 is depicted in FIG. 10. Thru-epi via 132 is formed by etching from the exposed surface of the n-type epilayers 104 and ending on p-contact metal 114. Thru-epi via 132 is formed in a location that allows it to contact the p-type metal contact 114 when the etch has gone completely through the isolation regions 155 (or combination of region 112 and 130). Therefore, thru-epi via 132 is between about 2 and 20 µm in depth, and is typically between about 5 and 10 µm in depth.

The thru-epi via 132 is formed by any suitable etching method, but is preferably carried out with RIE. An exemplary set of conditions for forming thru-metal via 132 is to etch for about 30 minutes using C12/BC13 as an etching gas at a chamber pressure of about 15 mT and about 100W of power.

Figure 11:
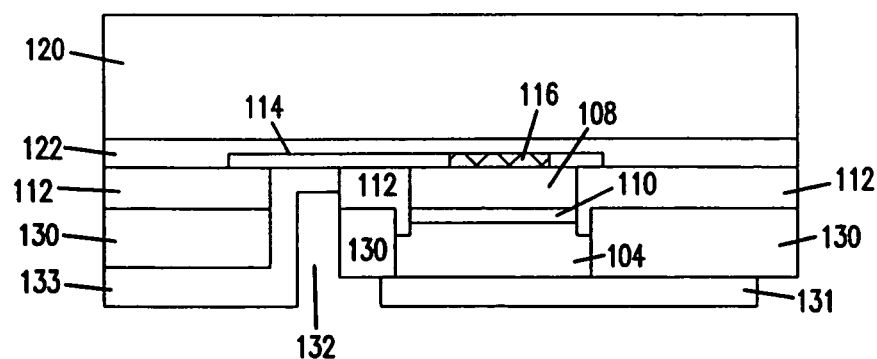

A device of the invention after the next step in the process, the formation of the thru-epi metal 133 is depicted in FIG. 11. Thru-epi metal 133 is formed so that it traverses through the thru-epi via 132 and contacts p-type contact metal 114. Thru-epi metal 133 functions to bring the p-contact to the bottom surface of the device.

Thru-epi metal 133 may be made of any suitable conductive material, such as a metal, e.g. gold (Au), silver (Ag), copper (Cu), aluminum (Al), tungsten (W), an alloy, e.g., aluminum/copper (Al/Cu), titanium tungsten (TiW), or the like. Preferably, the conductive material that is utilized is gold, and is formed by electro-plating. An exemplary set of conditions for this step is to deposit 2 μm of gold (Au) by conventional electro-plating methods.

Figure 12:
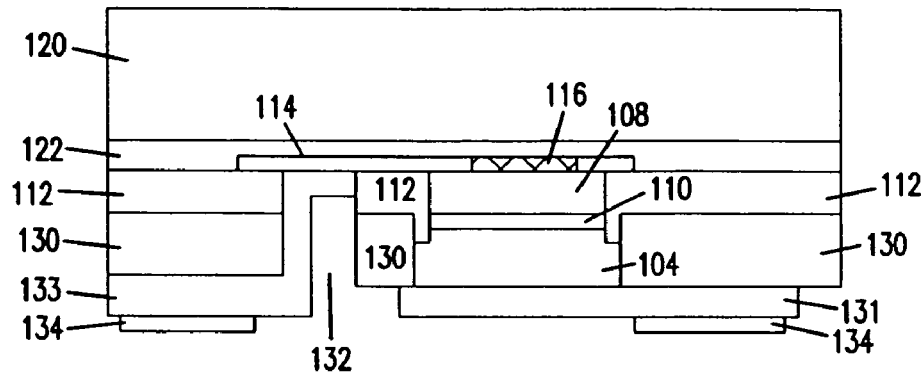

A device of the invention after the next step, the formation of bottom bond pads 134 after a backside surface passivation using dielectric film such as $SiO_2$ is depicted in FIG. 12. Bond pad metal 134 can be formed by any method known to those of skill in the art, such as E-Beam deposition, sputtering and patterned with lift-off processes, or the like. Preferably bond pad metal 134 is formed using E-Beam deposition. An exemplary set of conditions for formation of bond pad metal 134 comprises depositing a 0.5 μm thick layer of Ni/Au by E-Beam deposition.

Figure 13:
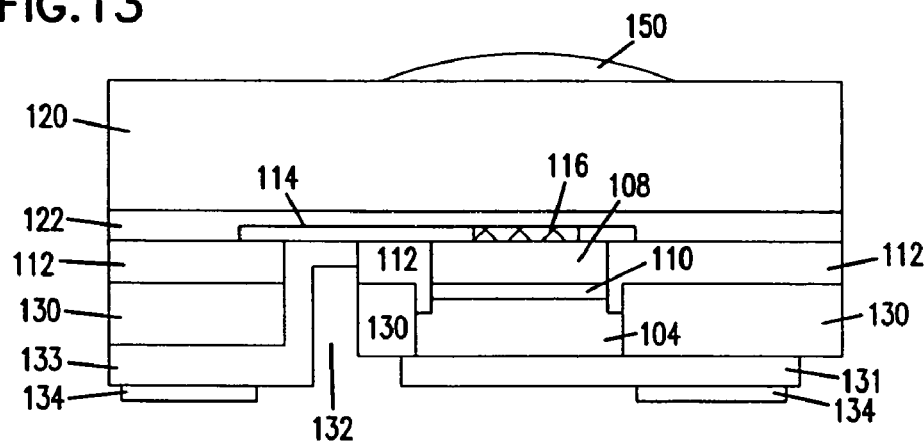

A device of the invention after the next step of the process, integrating a wafer of micro-optical devices 150 onto the top surface 124 of superstrate 120, is depicted in FIG. 13. The micro-optical devices 150 are placed on the top surface 124 of superstrate 120 such that the micro-optical devices 150 are aligned with corresponding device regions 160 to provide an optical processing capability to the device. In one embodiment the micro-optic devices are formed onto the top surface 124 of the superstrate 120. In another embodiment the micro-optical devices 150 are attached to the top surface 124 of the superstrate 120 after having been formed on a separate substrate. A wafer containing micro-optical devices 150 can be fabricated separately, and then be integrated to the top surface 124 of the superstrate 120 with optical adhesive. Micro-optical device 150 can but need not be fabricated on a separate substrate, then tested and qualified before integrating them into devices of the invention.

Figure 14:
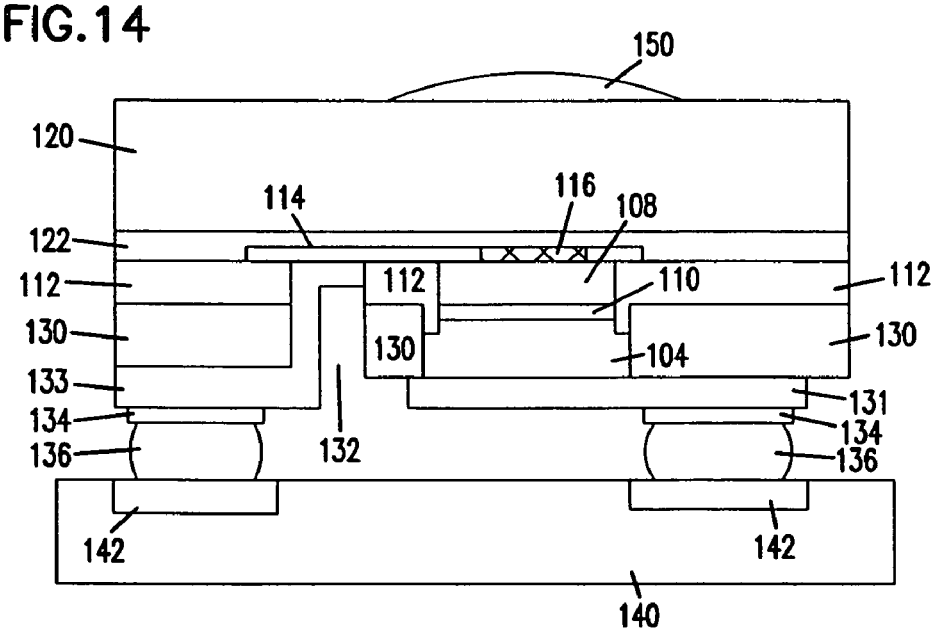

A device after the next step in the process, bonding the device to the integrated circuit 140 can be seen in FIG. 14. This can be accomplished by any method known to those of skill in the art. One example of a useful process includes dicing the device of the invention to include multiple light emitter elements, or multiple detecting elements, or combination of light emitting/detector elements, including the micro-optical devices 150, to produce a large scale optoelectronic device array chips. After dicing, the bottom contact pads 134 of the devices are attached with matching pads 142 of an integrated circuit 140, such as an electronic large scale integrated circuit (VLSI) to produce an optoelectronic integrated circuit device. The resulting device is an electronic integrated circuit device with a large number of optical input/output (detecting/emitting) channels. In one embodiment the bottom contact pads 134 of the device are bump bonded 146 to the matching pads 142 of the integrated circuit 140. Solder bumps can be formed either on bond pad 134 of the optoelectronic device, or on bond pad 142 of the integrated circuit device 140.

The embodiments set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for fabricating an optoelectronic device, comprising:
    forming, upon a top surface of a substrate, a device region that includes a top surface and a bottom surface;
    forming an isolation region configured such that the device region is surrounded by the isolation region;
    providing a superstrate on the top surface of the device region, the superstrate including a top surface; and
    disposing a micro-optical device on the top surface of the superstrate.

2. The method as recited in claim 1, wherein forming the device region comprises depositing a plurality of epitaxial layers.

3. The method as recited in claim 1, wherein the device region is formed using MOCVD.

4. The method as recited in claim 1, wherein the device region comprises one of: an optical emitter; or, an optical detector.

5. The method as recited in claim 1, wherein the isolation region is formed by ion implantation of a portion of the device region and wherein formation of the isolation region includes definition of an active region.

6. The method as recited in claim 1, wherein provision of a superstrate on the top surface of the device region comprises one of: formation of a superstrate on the top surface of the device region; or, attachment of a superstrate wafer to the top surface of the device region.

7. The method as recited in claim 1, wherein the superstrate comprises a material that is optically transparent with regard to a wavelength associated with the device region.

8. The method as recited in claim 1, wherein the micro-optical device comprises one of: a collimating lens; a focusing lens; and, a refractive lens.

9. The method as recited in claim 1, further comprising bonding an integrated circuit to the bottom surface of the device region.

10. A method for fabricating an optoelectronic device, comprising:
    forming, upon a top surface of a substrate, a device region that includes a top surface and a bottom surface;
    forming, by ion implantation of a portion of the device region, a top isolation region configured such that the device region is surrounded by the top isolation region;
    forming a p-type contact metal that extends across an unimplanted region of the device region and onto the surrounding top isolation region;
    providing a superstrate on the top surface of the device region, the superstrate including a top surface;
    removing the substrate;

forming, by ion implantation of a portion of the device region, a bottom isolation region configured and arranged to electrically isolate contacts of the device region;

forming an n-type contact metal that extends across an unimplanted region of the device region and onto the bottom isolation region;

forming a thru-epi via by etching an exposed surface of the device region through to the p-type contact metal;

forming a thru-epi metal such that the thru-epi metal traverses through the thru-epi via and contacts the p-type contact metal;

forming a first bond pad on the bottom isolation region, and forming a second bond pad on the n-type contact metal;

disposing a micro-optical device on the top surface of the superstrate; and bonding an integrated circuit to the bottom surface of the device region.

11. The method as recited in claim 10, wherein forming the device region comprises:

forming an n-type epilayer on the top surface of the substrate;

forming an active layer on the n-type epilayer; and forming a p-type epilayer on the active layer.

12. The method as recited in claim 11, wherein formation of the top isolation region is performed by hydrogen implantation of the p-type epilayer; and, a portion of the n-type epilayer.

13. The method as recited in claim 10, wherein the p-contact metal is formed using E-beam deposition.

14. The method as recited in claim 10, further comprising formation of emitter/illumination window in the p-contact metal.

15. The method as recited in claim 10, wherein the superstrate is adhered to the device region with an optically transparent adhesive.

16. The method as recited in claim 10, wherein the n-contact metal is formed using E-beam deposition.

17. The method as recited in claim 10, wherein the thru-epi via is formed by RIE.

18. The method as recited in claim 10, wherein forming a thru-epi metal comprises electro-plating gold.

19. The method as recited in claim 10, wherein the bond pads are bump bonded to matching pads of the integrated circuit.

20. A method for fabricating an optoelectronic device, comprising:

forming, upon a top surface of a substrate, a device region;

forming an isolation region configured such that the device region is surrounded by the isolation region;

forming a contact layer on the device region;

providing a superstrate on a top surface of the device region and the contact layer; and disposing a micro-optical device on a top surface of the superstrate.

* * * * *